United States Patent [19]
Churei

[11] Patent Number: 6,055,385
[45] Date of Patent: *Apr. 25, 2000

[54] CAMERA

[75] Inventor: Kiyokazu Churei, Yokohama, Japan

[73] Assignee: Canon Kabushiki Kaisha, Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/944,359

[22] Filed: Oct. 6, 1997

[30] Foreign Application Priority Data

Oct. 14, 1996 [JP] Japan .................................. 8-289010
Jun. 30, 1997 [JP] Japan .................................. 9-187256

[51] Int. Cl.$^7$ .................................................. G03B 17/24
[52] U.S. Cl. .................................... 396/538; 396/542
[58] Field of Search ................................ 396/538, 542

[56] References Cited

U.S. PATENT DOCUMENTS 4,317,628  3/1982  Shimizu .................................. 396/542
5,526,085  6/1996  Hara et al. ............................. 396/538

*Primary Examiner*—David M. Gray
*Attorney, Agent, or Firm*—Robin, Blecker & Daley

[57] ABSTRACT

A camera includes an exterior member which forms an exterior of the camera, a camera body which forms a cartridge chamber portion having a cartridge chamber for loading a film cartridge therein, the cartridge chamber portion being disposed adjacent to the exterior member with a predetermined clearance therebetween and having a recessed part formed in one side thereof facing the exterior member, and a flexible printed circuit board on which at least one electric part is mounted, the flexible printed circuit board being disposed between the exterior member and the cartridge chamber portion in such a manner that the electric part is accommodated in the recessed part. With such a construction of the camera, the flexible printed circuit board on which the electric part is mounted can be disposed between the camera body and the exterior member without increasing a clearance (gap) between the camera body and the exterior member, so that the thickness of the camera as a whole can be prevented from being increased.

12 Claims, 6 Drawing Sheets

CAMERA

BACKGROUND OF THE INVENTION

1. Field of the Invention

The present invention relates to a camera having a film cartridge chamber for loading a film cartridge therein.

2. Description of Related Art

In an attempt to reduce the mounted thickness of electric parts, an arrangement has been developed to reduce the whole thickness of a printed wiring board (hereinafter referred to as PWB) by forming a recessed part in the PWB to place the electric parts therein, as disclosed in Japanese Utility Model Publication No. SHO 57-38934.

FIG. 9 shows the above arrangement as applied to a camera, as a first example of prior art. In FIG. 9, there are illustrated a PWB 101, a recessed part 101a formed in the PWB 101, electric parts 102 mounted on the PWB 101, a cartridge chamber wall 103 having a film cartridge chamber formed to permit loading a film cartridge 105 therein and having a film passage port, and an exterior cover 104 formed in such a shape as to house therein all of the PWB 101, the electric parts 102, the cartridge wall 103 and the film cartridge 105.

In the case of the arrangement shown in FIG. 9, there is provided a clearance (gap) L100 between the cartridge chamber wall 103 and the exterior cover 104. The PWB 101 on which the electric parts 102 are mounted is disposed within the clearance L100. The mounting efficiency can be enhanced by mounting the PWB 101 in such a place with electric circuits concentrically arranged on the PWB 101.

FIG. 10 shows, as a second example of prior art, an arrangement applied to a camera, which is similar to the arrangement shown in FIG. 9. In FIG. 10, there are illustrated a flexible printed circuit board 111 (hereinafter referred to as FPC), an electric part 112 mounted on the FPC 111, a cartridge chamber wall 113 having a film cartridge chamber formed to permit loading a film cartridge 115 therein and having a film passage port, and an exterior cover 114 formed in such a shape as to house therein all of the FPC 111, the electric part 112, the cartridge chamber wall 113 and the film cartridge 115.

In the arrangement shown in FIG. 10, there is also provided a clearance (gap) L110 between the cartridge chamber wall 113 and the exterior cover 114, as in the case of FIG. 9. The FPC 111 on which the electric part 112 is mounted is disposed within the clearance L110, thereby enhancing electric-part mounting efficiency, as in the case of FIG. 9.

In each of the arrangements shown in FIGS. 9 and 10, the electric parts are mounted to have them on the side facing the exterior cover (the PWB or the FPC being on the side of the cartridge chamber wall). In some cases, however, the electric parts are mounted to have them on the opposite side, i.e., on the side facing the cartridge chamber wall (the PWB or the FPC being on the side of the exterior cover).

Further, although it is not aimed at reduction in mounting thickness, an arrangement for mounting a so-called DX contact piece by forming a hole in the cartridge chamber wall, for making an ISO sensitivity value of a film in use detectable, has been developed, as disclosed in Japanese Utility Model Publication No. HEI 6-45045.

FIG. 11 shows the above arrangement as a third example of prior art. Referring to FIG. 11, there are illustrated an FPC 121, an electric part 122 mounted on the FPC 121, a cartridge chamber wall 123 having a film cartridge chamber formed to permit loading a film cartridge 126 therein and having a film passage port, a hole 123a formed in a part of the cartridge chamber wall 123, an exterior cover 124 formed in such a shape as to house therein all of the FPC 121, the electric part 122, the cartridge chamber wall 123, etc., and a DX contact piece 125 bent in an L shape and having one end thereof mounted on the FPC 121 and the other end arranged to be in contact with a DX pattern formed on the surface of the film cartridge 126.

In the arrangement shown in FIG. 11, the FPC 121 having the electric part 122 mounted thereon is disposed in the same place as in the case of FIG. 10. While the DX contact piece 125 is set with its wiring, a clearance between the cartridge chamber wall 123 and the exterior cover 124 is effectively utilized for the FPC 121.

Cameras are generally configured to have a larger thickness at a film cartridge chamber in which a film cartridge is to be placed than at a spool chamber in which the film is to be wound. Therefore, to attain reduction in thickness of a camera, the camera must be arranged to be thinner at the vicinity of the film cartridge chamber.

However, in the first example of prior art shown in FIG. 9, the arrangement for reducing the mounting thickness as a whole by forming the recessed part 101a in the PWB 101 to place the electric part 102 therein has the following shortcomings.

(i) Since there is required an additional process for forming the recessed part 101a in the PWB 101, an increase in cost results.

(ii) Since the clearance L100 between the cartridge chamber wall 103 and the exterior cover 104 must be equal to or greater than the sum of the height of the electric part 102 and the thickness of the recessed part 101a of the PWB 101, no great reduction in thickness of the camera can be attained.

Further, in the second example of prior art shown in FIG. 10, in which the FPC 111 is used in place of the PWB 101, the clearance L110 between the cartridge chamber wall 113 and the exterior cover 114 must be equal to or greater than the sum of the height of the electric part 112 and the thickness of the FPC 111 because it is impossible to form any recessed part in the FPC 111. Therefore, no great reduction in thickness of the camera can be attained.

Further, in the case of the third example of prior art shown in FIG. 11, the DX contact piece 125 disposed within the cartridge chamber is arranged to be extended through the hole 123a of the cartridge chamber wall 123 to the outside and to be fixed to the FPC 121 by soldering after the FPC 121 is mounted on the cartridge chamber wall 123. Therefore, there are the following shortcomings.

(a) Since the DX contact piece 125 must be set obliquely in front of the cartridge chamber and the hole 123a of the cartridge chamber wall 123 is formed also in an oblique front position accordingly as shown in FIG. 11, no reduction in thickness of the camera results.

(b) Since the electric part 122 is mounted, in general, on the surface of the FPC 121 on the side facing the exterior cover 124, the clearance L120 between the cartridge chamber wall 123 and the exterior cover 124 must be equal to or greater than the sum of the height of the electric part 122 and the thickness of the FPC 121. Therefore, no reduction in thickness of the camera can be attained.

BRIEF SUMMARY OF THE INVENTION

In accordance with one aspect of the invention, there is provided a camera, which comprises an exterior member which forms an exterior of the camera, a camera body which forms a cartridge chamber portion having a cartridge chamber for loading a film cartridge therein, the cartridge chamber portion being disposed adjacent to the exterior member with a predetermined clearance therebetween and having a recessed part formed in one side thereof facing the exterior member, and a flexible printed. circuit board on which at least one electric part is mounted, the flexible printed circuit board being disposed between the exterior member and the cartridge chamber portion in such a manner that the electric part is accommodated in the recessed part. With such a construction of the camera, the flexible printed circuit board on which the electric part is mounted can be disposed between the camera body and the exterior member without increasing a clearance (gap) between the camera body and the exterior member.

The above and other aspects and features of the invention will become apparent from the following detailed description of embodiments thereof taken in conjunction with the accompanying drawings.

DETAILED DESCRIPTION OF THE INVENTION

Hereinafter, preferred embodiments of the invention will be described in detail with reference to the drawings.

Figure 1:
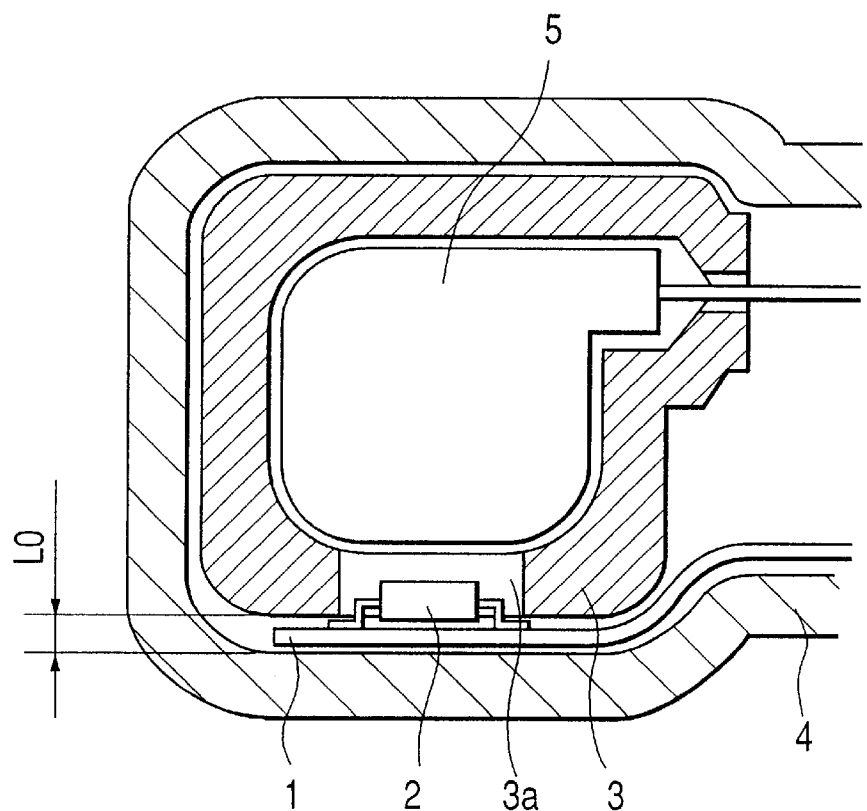
FIG. 1 is a horizontal sectional view showing the vicinity of a cartridge chamber in a camera according to a first embodiment of the invention.

FIG. 1 is a horizontal sectional view showing the vicinity of a cartridge chamber in a camera according to a first embodiment of the invention. Referring to FIG. 1, reference numeral 1 denotes an FPC (flexible printed circuit board), a part of which is disposed in the vicinity of the cartridge chamber. On one side of the FPC 1, there is mounted at least one electric part 2. Reference numeral 3 denotes a cartridge chamber wall, which has the cartridge chamber formed to permit loading a film cartridge 5 therein. The electric part 2 is located in front of the cartridge chamber wall 3 when the FPC 1 is set in position. A hole 3a for accommodating the electric part 2 therein is provided at a part of the cartridge chamber wall 3 opposed to the electric part 2. Reference numeral 4 denotes an exterior cover 4 formed in such a shape as to house therein all of the FPC 1, the electric part 2, and the cartridge chamber wall 3.

Figure 2:
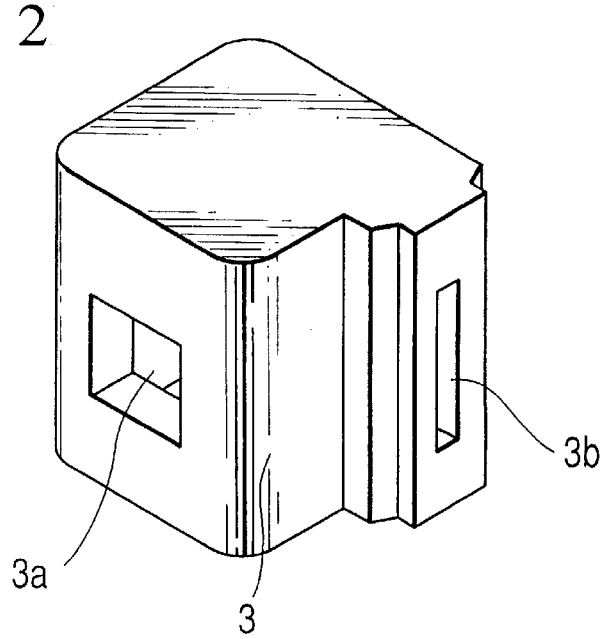
FIG. 2 is a perspective view showing a cartridge chamber wall shown in FIG. 1.

FIG. 2 is a perspective view showing in detail the arrangement of the cartridge chamber wall 3. The outside appearance of the cartridge chamber wall 3 presents an angular cylindrical shape. The hole 3a formed in the front side of the cartridge chamber wall 3 is a through-hole in which the entirety of the electric part 2 (including its body portion and its lead line portion) can be situated. A film passage port 3b is longitudinally formed in one side of the cartridge chamber wall 3 facing the center of the body of the camera. Incidentally, the cartridge chamber wall 3 is provided with a loading opening for inserting the film cartridge 5 from below, as viewed in FIG. 2.

The electric part 2 is mounted on the surface of the FPC 1 on the side of the cartridge chamber wall 3. The FPC 1 is fitted on the cartridge chamber wall 3 in such a way as to put the electric part 2 into the hole 3a of the cartridge chamber wall 3. By virtue of the provision of the hole 3a, a clearance L0 between the cartridge chamber wall 3 and the exterior cover 4 is allowed to be about equal to the thickness of one sheet of the FPC 1. Therefore, unlike the conventional arrangement described in the foregoing, the clearance L0 does not have to be larger with the height of the electric part 2 taken into consideration. The FPC 1 on which the electric part 2 is mounted thus can be fitted on the cartridge chamber wall 3 without causing any increase in thickness of the camera.

Figure 3:
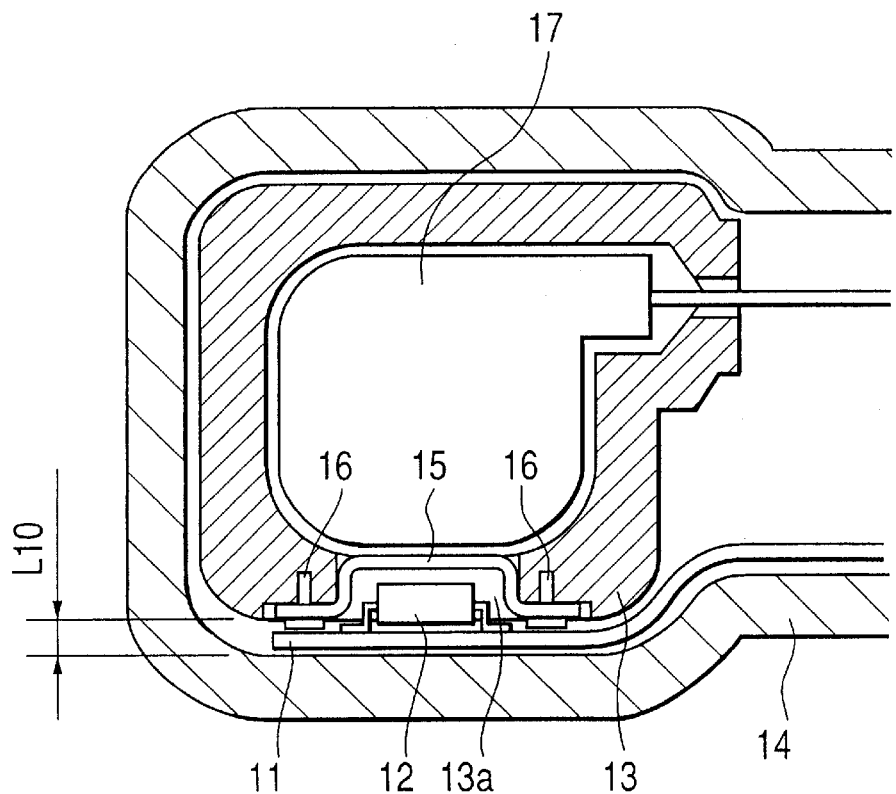
FIG. 3 is a horizontal sectional view showing the vicinity of a cartridge chamber in a camera according to a second embodiment of the invention.

FIG. 3 is a horizontal sectional view showing the vicinity of a cartridge chamber in a camera according to a second embodiment of the invention. Referring to FIG. 3, in the second embodiment, an FPC 11 on which at least one electric part 12 is mounted is disposed in the vicinity of the cartridge chamber. A cartridge chamber wall 13 is provided with the cartridge chamber for loading a film cartridge 17 therein. Further, the cartridge chamber wall 13 is provided with a hole 13a in a part opposed to the electric part 12 when the FPC 11 is fitted in position. An exterior cover 14 is formed in such a shape as to house therein all of the FPC 11, the electric part 12 and the cartridge chamber wall 13. A lid member 15 is attached with screws 16 to the cartridge chamber wall 13 so as to cover the hole 13a which is provided in the cartridge chamber wall 13.

Figure 4:
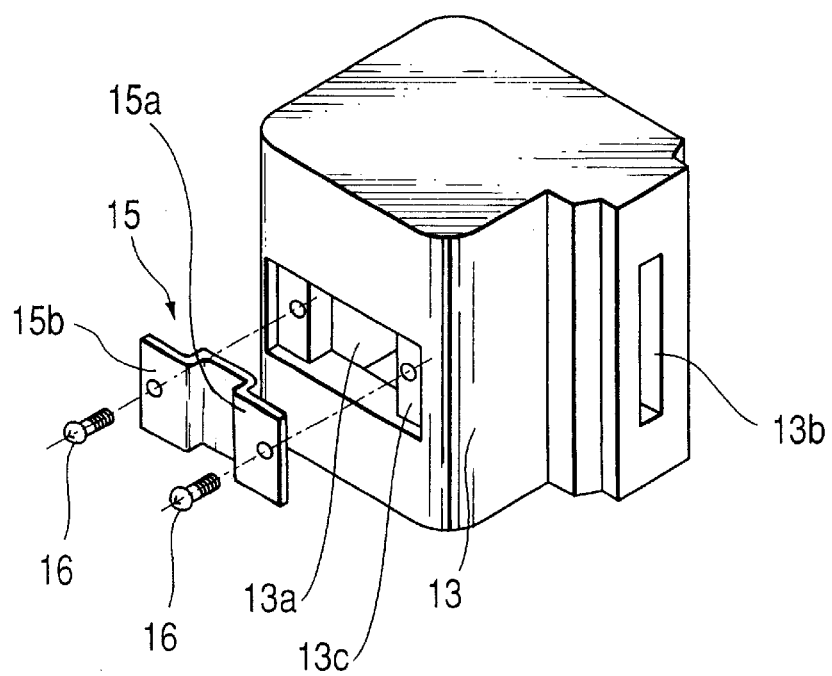
FIG. 4 is a perspective view showing a cartridge chamber wall shown in FIG. 3.

FIG. 4 is a perspective view showing in detail the arrangement of the cartridge chamber wall 13 and the lid member 15. As shown in FIG. 4, the cartridge chamber wall 13 is provided with the hole 13a and the film passage port 13b, which are similar in shape to those of the cartridge chamber wall 3 shown in FIG. 2. Grooves 13c are provided on two opposite sides of the hole 13a for positioning the two end parts of the lid member 15 and for burying the thickness portion of the lid member 15 therein. The lid member 15 is formed in an approximately Ω-like shape and is composed of a protruding part 15a and fixing parts 15b formed on two sides of the lid member 15. The protruding part 15a is formed to be fittable into the hole 13a and the fixing parts 15b to be fixedly secured to the grooves 13c with screws.

The lid member 15 is first mounted to cover the hole 13a of the cartridge chamber wall 13 as shown in FIG. 4. After that, the FPC 11 is fitted on the cartridge chamber wall 13 in such a manner that the electric part 12 is placed in a recessed part formed in the lid member 15 which covers the hole 13a of the cartridge chamber wall 13.

According to the arrangement shown in FIGS. 3 and 4, the lid member 15 is buried in the grooves 13c to have its surface flush with the surface of the cartridge chamber wall 13 and, in addition to that, the electric part 12 is set in a state of being buried in the hole 13a. The arrangement thus allows a clearance L10 between the cartridge chamber wall 13 and the exterior cover 14 to be only about the same as the thickness of one sheet of the FPC 11. It is, therefore, not necessary to arrange the clearance L10 to be larger with the height of the electric part 12 taken into consideration. The FPC 11 on which the electric part 12 is mounted, therefore, can be fitted on the cartridge chamber wall 13 without causing any increase in thickness (or depth) of the camera.

Figure 5:
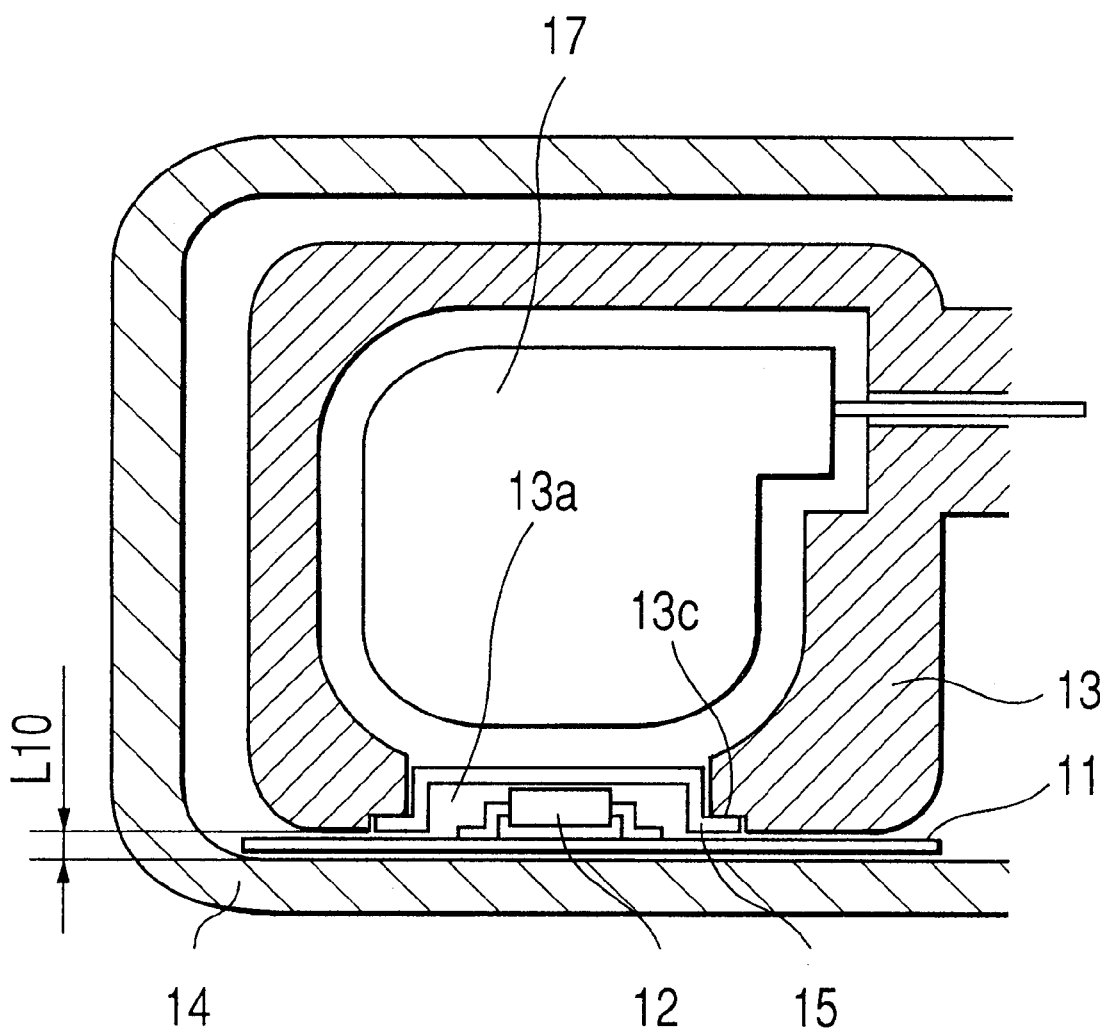
FIG. 5 is a horizontal sectional view showing the vicinity of a cartridge chamber in a camera arranged as a modification of the second embodiment shown in FIG. 3.

While the lid member 15 is arranged to be secured to the cartridge chamber wall 13 with the screws 16 in the case of the second embodiment as shown in FIGS. 3 and 4, the arrangement may be changed to have the lid member 15 in a floating state and positioned and held jointly by the FPC 11 and the grooves 13c as shown in FIG. 5. Further, as apparent from comparison of the shape shown in FIG. 5 with the shapes shown in FIGS. 1 and 3, the depth (or thickness) of the exterior cover obtained at its part covering the cartridge chamber wall may be either the same as the depth of its other parts as in the case of the modification shown in FIG. 5 or arranged to have a stepped difference from the depth of other parts as shown in FIGS. 1 and 3.

Figure 6:
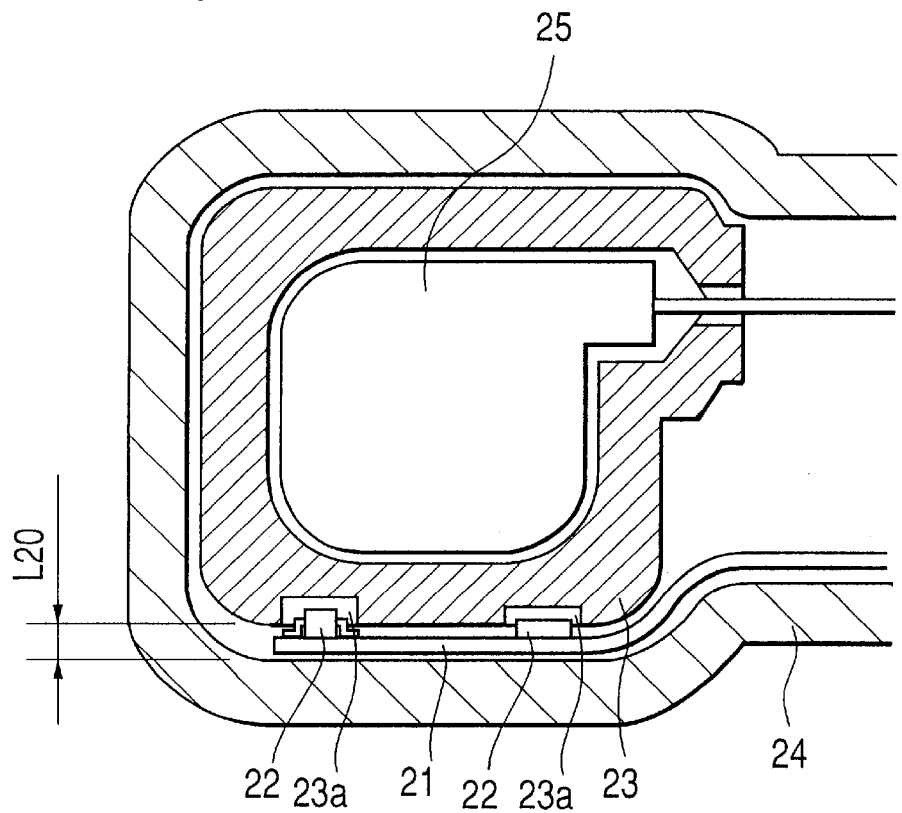
FIG. 6 is a horizontal sectional view showing the vicinity of a cartridge chamber in a camera according to a third embodiment of the invention.

FIG. 6 is a horizontal sectional view showing the vicinity of a cartridge chamber in a camera according to a third embodiment of the invention. Referring to FIG. 6, an FPC 21 is disposed in part in the vicinity of the cartridge chamber. A plurality of electric parts 22 are mounted on one side of the FPC 21. A cartridge chamber wall 23 is provided with the cartridge chamber for loading a film cartridge 25 therein. An exterior cover 24 is formed in such a shape as to house therein all of the FPC 21, the electric parts 22 and the cartridge chamber wall 23.

Figure 7:
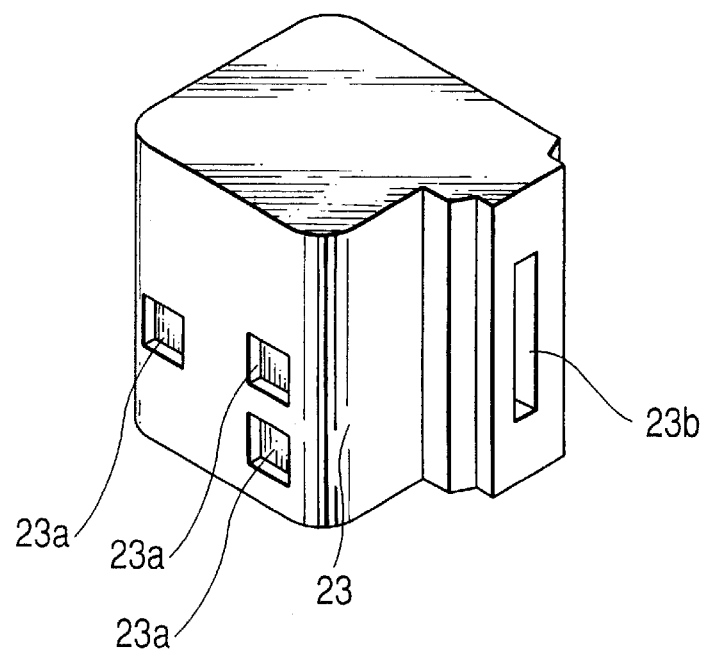
FIG. 7 is a perspective view showing a cartridge chamber wall shown in FIG. 6.

FIG. 7 is a perspective view showing in detail the arrangement of the cartridge chamber wall 23. Referring to FIG. 7, the cartridge chamber wall 23 is provided with recessed parts 23a which are formed for the electric parts 22 in its front parts which are respectively opposed to the electric parts 22 when the FPC 21 is fitted in position. The recessed parts 23a respectively have the corresponding electric parts 22 put therein at the time of assembly. Each of the recessed parts 23a is formed by machining to have a depth exceeding the height (or thickness) of the corresponding electric part 22. A film passage port 23b is formed in a side part of the cartridge chamber wall 23.

As shown in FIG. 6, the electric parts 22 are mounted on the parts of the FPC 21 facing the cartridge chamber wall 23. In fitting the FPC 21 on the cartridge chamber wall 23, the electric parts 22 are respectively put into the recessed parts 23a of the cartridge chamber wall 23. The arrangement shown in FIGS. 6 and 7 enables a clearance L20 (gap) between the cartridge chamber wall 23 and the exterior cover 24 to be only about equal to the thickness of one sheet of the FPC 21. The clearance L20, therefore, does not have to be larger with the height of the electric parts 22 taken into consideration. The FPC 21 on which the electric parts 22 are mounted thus can be fitted on the cartridge chamber wall 23 without causing any increase in thickness of the camera.

Figure 8:
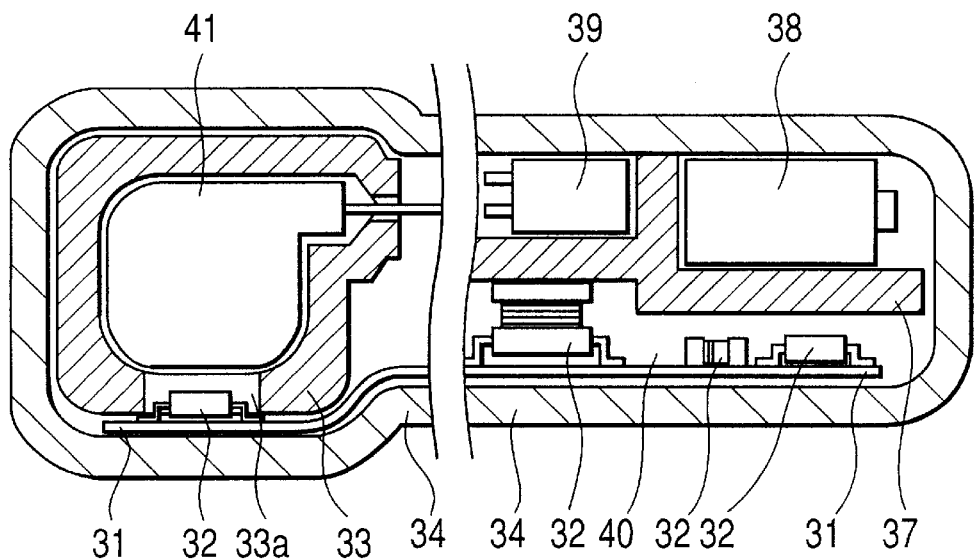
FIG. 8 is a horizontal sectional view showing a camera according to a fourth embodiment of the invention.
Figure 9:
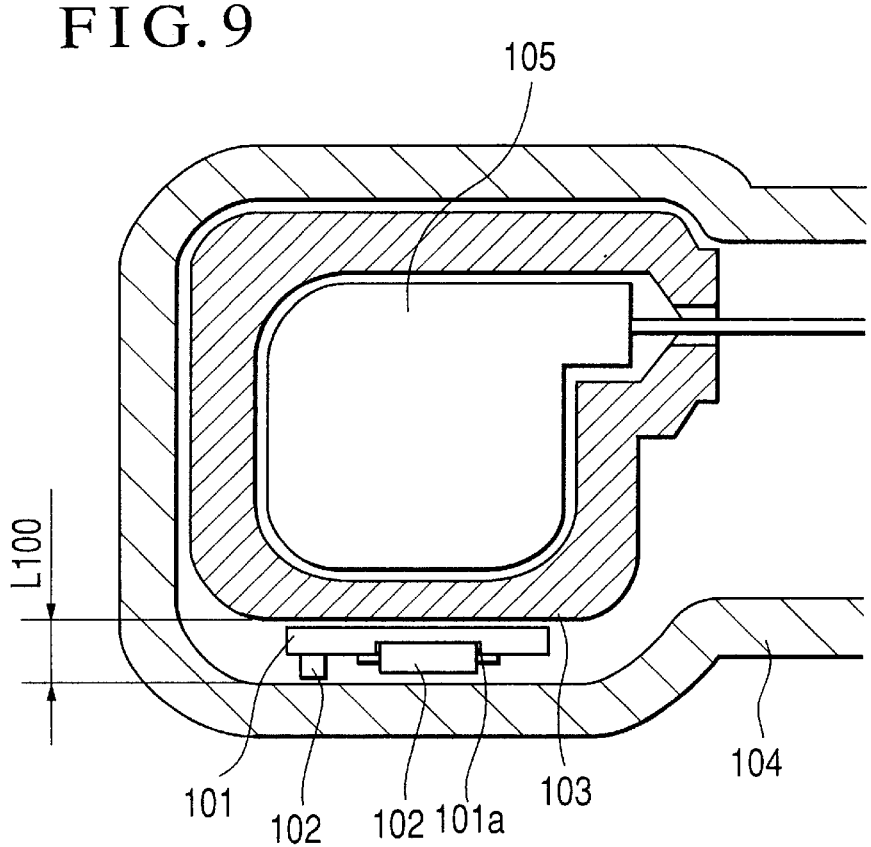
FIG. 9 is a horizontal sectional view showing the vicinity of a cartridge chamber in a camera as a first example of prior art.
Figure 10:
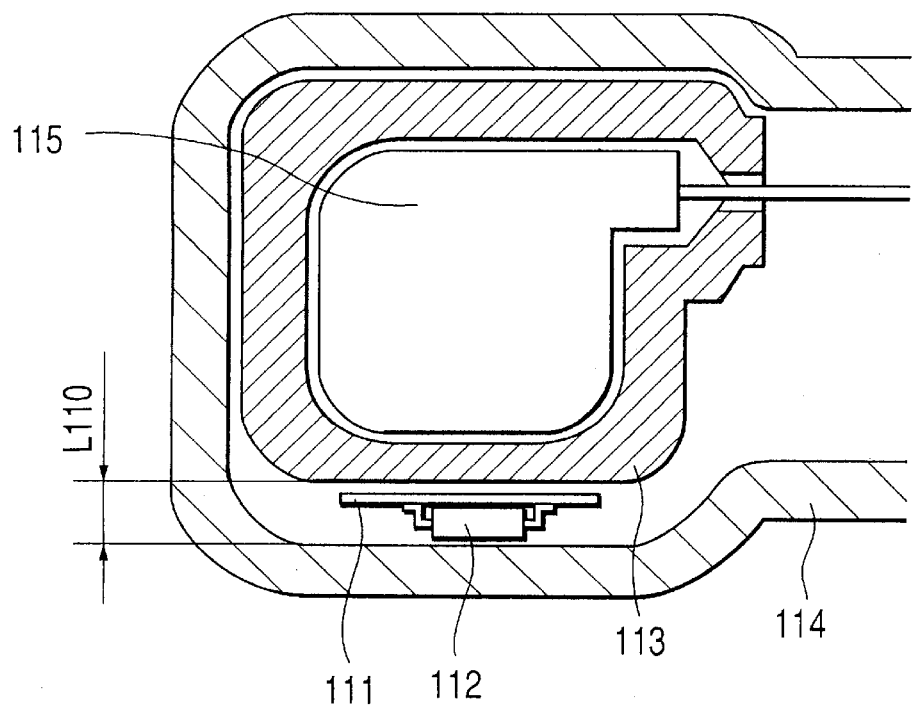
FIG. 10 is a horizontal sectional view showing the vicinity of a cartridge chamber in a camera as a second example of prior art.
Figure 11:
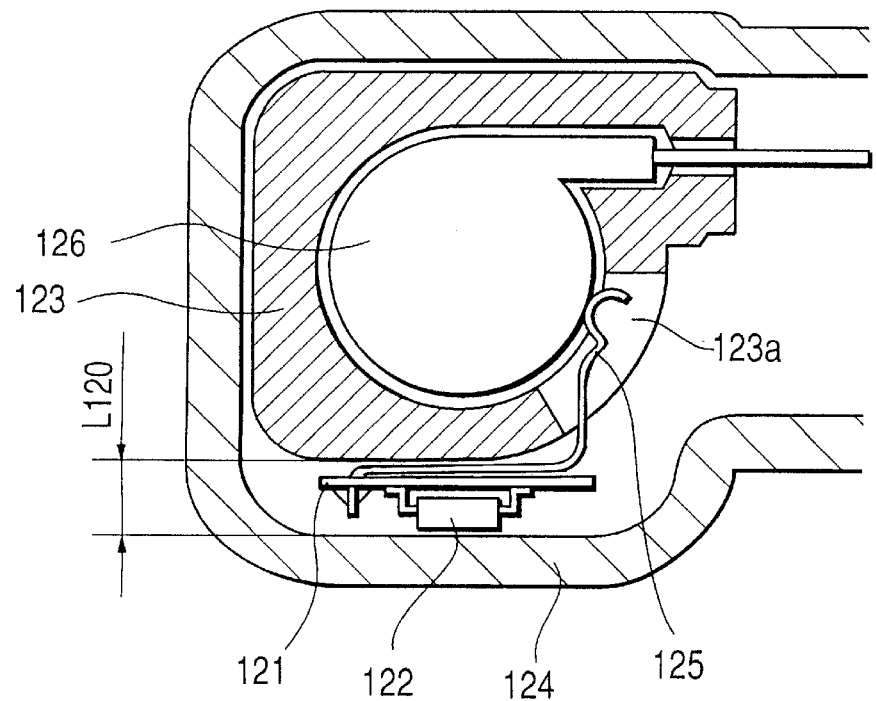
FIG. 11 is a horizontal sectional view showing the vicinity of a cartridge chamber in a camera as a third example of prior art.

FIG. 8 is a horizontal sectional view showing a camera and the vicinity of a cartridge chamber thereof according to a fourth embodiment of the invention. In the case of FIG. 8, the arrangement of the first embodiment is applied to the vicinity of the cartridge chamber. A hole 33a is formed in a cartridge chamber wall 33. An FPC 31 having one or more electric parts 32 mounted on its one side facing the cartridge chamber wall 33 is arranged to be fitted on the cartridge chamber wall 33 by putting the electric part or parts 32 into the hole 33a. A camera body 37 serves as a partition member or a housing member to allow a battery 38 and a capacitor 39 of a flash device to be arranged sideways in lower rear parts of the camera. An exterior cover 34 forms an outer casing of the whole camera.

Generally, the battery or the flash-device capacitor for use in the camera is smaller in diameter than a film cartridge and shorter in length than the lens barrel (not shown). As a result, in the case of the fourth embodiment, a space 40 arises between the exterior cover 34 and the camera body 37 in front of the battery 38 and the flash-device capacitor 39 which are arranged sideways as shown in FIG. 8. Other electric parts 32 thus can be mounted on an extended part of the FPC 31 within the space 40. Therefore, the FPC 31 on which the electric parts 32 are mounted can be fitted in the camera without causing any increase in thickness of the camera.

In the case of each of the embodiments disclosed in the foregoing, the invention is applied by way of example to a cartridge chamber which is adapted for a film cartridge conforming to the specifications of APS (Advanced Photo System™). However, the invention is not limited to the cameras adapted for use of a film cartridge of the APS specifications but is of course applicable also to cameras arranged to use a film cartridge conforming to the so-called 135 film format. Further, it goes without saying that the invention may be carried out by combining as necessary the embodiments disclosed.

I claim:
1. A camera comprising:
   an exterior member which forms an exterior of said camera;
   a camera body which forms a cartridge chamber portion having a cartridge chamber for loading a film cartridge therein, said cartridge chamber portion being disposed adjacent to said exterior member with a predetermined clearance therebetween and having a recessed part formed in one side thereof facing said exterior member; and
   a flexible printed circuit board on which at least one electric element is mounted, said flexible printed circuit board being disposed between said exterior member and said cartridge chamber portion in such a manner that said electric element is accommodated in said recessed part,
   wherein at least part of a portion of the flexible printed circuit board which does not mount the electric element overlaps with a portion of the cartridge chamber not having the recessed part, and the thickness of the cartridge chamber portion at the recessed part is thinner than the thickness of the cartridge chamber portion overlapped by the printed circuit portions, and wherein said electric element, as a whole, overlaps with the flexible printed circuit board and is located on the cartridge side of the flexible printed circuit board.
2. A camera according to claim 1, wherein said recessed part includes an opening part which pierces said cartridge chamber portion from the outside of said cartridge chamber to the inside thereof.

3. A camera according to claim 1, wherein said recessed part includes a recessed part which does not pierce said cartridge chamber portion from the outside of said cartridge chamber to the inside thereof.

4. A camera according to claim 2, wherein said camera body includes a lid member which covers said opening part while leaving a space for accommodating said electric part therein.

5. A camera according to claim 1, wherein said flexible printed circuit board includes a circuit board portion which extends away from said cartridge chamber portion along said exterior member.

6. A camera according to claim 5, wherein said circuit board portion includes a portion on which an electric part other than said electric part accommodated in said recessed part is mounted.

7. A camera according to claim 1, wherein said electric part and said recessed part are disposed adjacent to a part of said exterior member located on an opposite side of a part of said exterior member to which a film thrust out from the film cartridge is to be adjacent.

8. A camera according to claim 1, wherein said recessed part of said camera body includes at least first and second recessed parts, and wherein, on said flexible printed circuit board, there are mounted at least first and second electric parts which are accommodated in said first and second recessed parts.

9. A camera according to claim 1, wherein said predetermined clearance is less than the sum of the thickness of said electric part and the thickness of said flexible printed circuit board.

10. A camera comprising:

an exterior member which forms an exterior of said camera;

a camera body which forms a cartridge chamber portion having a cartridge chamber for loading a film cartridge therein, said cartridge chamber portion having a recessed part formed therein extending toward said cartridge chamber; and a flexible printed circuit board on which at least one electric element is mounted, said flexible printed circuit board being disposed exteriorly of said recessed part and between said exterior member and said cartridge chamber portion, said electric element being disposed in said recessed part, wherein at least part of a portion of the flexible printed circuit board which does not mount the electric element overlaps with a portion of the cartridge chamber not having the recessed part, and the thickness of the cartridge chamber portion at the recessed part is thinner than the thickness of the cartridge chamber portion overlapped by the printed circuit portions, and wherein said electric element, as a whole, overlaps with the flexible printed circuit board and is located on the cartridge side of the flexible printed circuit board.

11. A camera comprising:

an exterior member which forms an exterior of said camera;

a camera body which forms a cartridge chamber portion having a cartridge chamber for loading a film cartridge therein, said cartridge chamber portion having a recessed part formed therein, said recessed portion being bounded continuously perimetrically by said cartridge chamber portion; and a flexible printed circuit board on which at least one electric element is mounted, said flexible printed circuit board being disposed between said exterior member and said cartridge chamber portion, said electric element being disposed in said recessed part, wherein at least part of a portion of the printed circuit board which does not mount the electric element overlaps with a portion of the cartridge chamber not having the recessed part, and the thickness of the cartridge chamber portion at the recessed part is thinner than the thickness of the cartridge chamber portion overlapped by the printed circuit portion, and wherein said electric element, as a whole, overlaps with the printed circuit board and is located on the cartridge side of the printed circuit board.

12. A camera comprising:

an exterior member which forms an exterior of said camera;

a camera body which forms a cartridge chamber portion having a cartridge chamber for loading a film cartridge therein, said cartridge chamber portion being disposed adjacent to said exterior member with a predetermined clearance therebetween and having a recessed part formed in one side thereof facing said exterior member; and a flexible printed circuit board on which at least one electric element is mounted, said flexible printed circuit board being disposed between said exterior member and said cartridge chamber portion in such a manner that said electric element is accommodated in said recessed part, wherein at least part of a portion of the flexible printed circuit board which does not mount the electric element overlaps with a portion of the cartridge chamber not having the recessed part, the thickness of the cartridge chamber portion at the recessed part is thinner than the thickness of the cartridge chamber portion overlapped by the printed circuit portion, the flexible printed circuit board having the electric element placed on the side of the circuit facing the cartridge chamber portion of the camera body, the electric element being located in the recessed part and axially aligned with a part of the cartridge chamber having no recessed part in the direction along the face of the flexible printed circuit board and said electric element, as a whole, overlapping with the flexible printed circuit board and being located on the cartridge side of the flexible printed circuit board.

* * * * *